US 6,580,644 B1

(12) United States Patent
Chung

(10) Patent No.: US 6,580,644 B1
(45) Date of Patent: Jun. 17, 2003

(54) FLASH MEMORY DEVICE CAPABLE OF CHECKING MEMORY CELLS FOR FAILURE CHARACTERISTICS

(75) Inventor: Hwi-Taek Chung, Kyunggi-do (KR)

(73) Assignee: Samusung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/091,048

(22) Filed: Mar. 4, 2002

(30) Foreign Application Priority Data

May 31, 2001 (KR) .......................................... 01-30384

(51) Int. Cl.[7] .............................................. G11C 16/06
(52) U.S. Cl. ........................... 365/185.22; 365/185.09; 365/185.2; 365/185.21
(58) Field of Search .................... 365/185.2, 185.21, 365/185.22, 185.09, 185.33

(56) References Cited

U.S. PATENT DOCUMENTS

| 5,132,935 A | | 7/1992 | Ashmore, Jr. |
| 5,220,533 A | | 6/1993 | Turner |
| 5,513,193 A | | 4/1996 | Hashimoto |
| 5,708,602 A | * | 1/1998 | Yamada .................... 365/185.2 |
| 5,781,477 A | | 7/1998 | Rinerson et al. |
| 5,805,501 A | | 9/1998 | Shiau et al. |
| 6,163,484 A | * | 12/2000 | Uekubo .................... 365/185.2 |

* cited by examiner

Primary Examiner—Son Mai
(74) Attorney, Agent, or Firm—Marger Johnson & McCollom P.C.

(57) ABSTRACT

A nonvolatile semiconductor memory device is provided, which supports an erase verify operation mode to determine whether an erased memory cell is lower than a maximal threshold voltage (e.g., 3V), and a test verify operation mode to determine whether the erased memory cell has a progressive fail characteristic. Once the memory device enters the test verify operation mode, a wordline voltage to be applied to a memory cell and a reference wordline voltage to be applied to a reference cell are generated. The wordline and reference wordline voltages generated in the test verify operation mode are set to be higher than those generated in the erase verify operation mode. This makes it possible to compare current flowing through the memory cell and reference cell at more than one level and to check a memory cell for a progressive (or potential) failing characteristic.

21 Claims, 7 Drawing Sheets

FLASH MEMORY DEVICE CAPABLE OF CHECKING MEMORY CELLS FOR FAILURE CHARACTERISTICS

RELATED APPLICATION

This application claims priority from Korean Patent Application No. 2001-30384, filed on May 31, 2001, the contents of which are herein incorporated by reference in their entirety.

TECHNICAL FIELD

The present invention relates to a nonvolatile semiconductor memory device and, more particularly, to a flash memory device capable of checking memory cells with a progressive fail characteristic.

BACKGROUND OF THE INVENTION

Many nonvolatile semiconductor memory devices are flash memory devices having a plurality of memory cells arranged in a matrix of rows and columns. The flash memory device is capable of erasing an array of memory cells at the same time, and provides an ability to electrically program or read out information of one or more memory cells in the array.

The memory cells of the flash memory device generally use floating gate transistors arranged with rows and columns. Each of the floating gate transistors has a source, a drain, a floating gate, and a control gate. A conventional flash memory cell is shown in FIG. 1. In that figure, a flash memory cell includes source and drain regions 2 and 3 formed in a P-type semiconductor substrate (or bulk) 1, a floating gate 6 formed over a channel region 5 between the source and drain regions 2 and 3, and a control gate 8 formed over the floating gate 6. A thin insulating film 4 having a thickness of about 100 Å is formed between the channel region 5 and the floating gate 6, and another insulating film 7 is formed between the floating gate 6 and the control gate 8. The control gate is connected to a wordline.

The following table shows approximate source, drain, control gate, and bulk voltages based upon program, read, and erase operations of a conventional flash memory device.

TABLE 1

| Operation Mode | Vg | Vd | Vs | Vb |
| --- | --- | --- | --- | --- |
| Program | +9V | +5V | 0V | 0V |
| Erase | −9V | floating | floating | +9V |
| Read | +4.5V | +1V | 0V | 0V |

As can be seen in the table, a flash memory cell is programmed by applying a ground voltage of 0V to the source region 2 and the semiconductor substrate 1, applying a high voltage of about 9V to the control gate, and applying a voltage of 5V capable of generating hot electrons to the drain region 3. Such a program operation is carried out to accumulate sufficient negative charges in the floating gate 6. Thus, the floating gate 8 has a positive potential to heighten a threshold voltage of the flash memory cell in a read operation.

During a read operation wherein a voltage of about 4.5V is applied to the control gate 8 and a ground voltage is applied to the source region 3, a channel region 5 of a threshold voltage heightened (i.e., programmed) memory cell does not become conductive. A current, which would otherwise flow from the drain region 3 through the channel region 5 to the source region 2, is prevented. At this time, the memory cell has an "off" state and its threshold voltage is distributed within a range of about 6V to 7V.

Flash memory cells existing in any sector are simultaneously erased by F-N tunneling (Fowler-Nordheim tunneling) scheme. According to F-N tunneling scheme, a negative high voltage of about −9V is applied to the control gate 8, and a positive voltage of 9V capable of causing F-N tunneling is applied to the semiconductor substrate 1. As shown in the above table, the source and drain regions 2 and 3 are held at a floating state. An erase operation performed according to such a bias condition is called a negative gate and bulk erase (NGBE) operation. Under such a bias condition, a strong electric field of about 6–7 MV/cm is produced between the control gate 8 and the semiconductor substrate 1 to cause F-N tunneling. In other words, the negative charges accumulated in the floating gate 6 are discharged to the semiconductor substrate 1 through the thin insulating film 5 of about 100 Å. Accordingly, the threshold voltage of the flash memory cell is lowered in a later-performed read operation.

Various erase methods associated with a flash memory device are disclosed in U.S. Pat. No. 5,781,477 entitled "Flash Memory System Having Fast Erase Operation", U.S. Pat. No. 5,132,935 entitled "Erase Of EEPROM Memory Arrays To Prevent Over-Erased Cell", U.S. Pat. No. 5.220,533 entitled "Method And Apparatus For Preventing Over-erase In A Flash Cell", U.S. Pat. No. 5,513,193 entitled "Nonvolatile Semiconductor Memory Device Capable Of Checking The Threshold Value Of Memory Cells", and U.S. Pat. No. 5,805,501 entitled "Flash Memory Device With Multiple Checkpoint Erase Logic".

After the foregoing NGBE operation is carried out, an erase verify operation is carried out to verify whether all flash memory cells in a sector are within a target threshold voltage range (e.g., 1V to 3V) corresponding to an "on" state. In the erase verify operation, a voltage (erase verify voltage) of about 3V is applied to the control gate 8, and the source region 2 and the semiconductor substrate 1 are grounded. Except for bias conditions, the erase verify operation can be carried out in the same manner as the read operation.

A threshold voltage of an erased flash memory cell is conventionally distributed within a range of 1V to 3V. However, when all memory cells in a sector are erased at the same time, a threshold voltage of some flash memory cells may be lowered to 1V or less. A flash memory cell having a threshold voltage of 1V or less is conventionally called an over-erased flash memory cell, which can be repaired by an erase repair operation for shifting a threshold voltage within a target threshold voltage range (1V to 3V) corresponding to an "on" state.

In the erase repair operation, the source region 2 of an over-erased flash memory cell and the semiconductor substrate 1 are grounded, a voltage of about 3V is applied to the control gate 8, and a voltage of 5V is applied to the drain region 3. Under such a bias condition, charges are accumulated in a floating gate 6, but less charge is accumulated than during a program operation. Therefore, the foregoing erase repair operation is carried out to shift a threshold voltage of an over-erased flash memory cell back to within the target threshold voltage range (1V to 3V).

After the erase and erase repair operations are completed, failed memory cells may be replaced with spare cells using a conventional redundancy technique. A current-voltage curve of an erased flash memory cell is shown in FIG. 2. A curve "10" is a current-voltage curve of a memory cell having the lowest threshold voltage (e.g., 1V), and a curve "12" is a current-voltage curve of a memory cell having the highest threshold voltage (e.g., 3V). A current-voltage curve of normally erased memory cells may exist between the curves "10" and "12". This curve will be referred to as a "normal voltage-current curve" hereinafter. As shown in FIG. 2, there is little or no difference between the slopes of current-voltage curves corresponding to erased cells (i.e., on-cells).

Because of processing problems, there may be a memory cell having a current-voltage curve whose slope is different from that of the normal current-voltage curve. This current-voltage curve will be referred to as an "abnormal current-voltage curve" hereinafter. If a slope of a current-voltage curve is considerably great, a memory cell having the slope is detected by the foregoing erase operation to be replaced using a conventional redundancy technique. However, if the slope of the current-voltage curve is not great, a normal read or write operation can be carried out, at least during the testing phase. For example, when a wordline voltage VREAD is applied to a memory cell having a curve "14", an amount of a cell current flowing through the memory cell is larger compared with a reference current. This means that the memory cell having the abnormal current-voltage curve "14" is normally determined as an "on-cell", and will not be replaced, even though it is a potentially defective cell.

If read and write operations are repeated in the potentially defective cell, a hole trap can be created at an insulator covering a floating gate to cause a charge loss of the floating gate. As a result, a memory cell having an abnormal current-voltage curve is changed in a coupling ratio, or a threshold voltage of the memory cell shifts. For example, the cell having the current-voltage curve "14" is changed to a current-voltage curve "16", as shown in FIG. 2. If a wordline voltage VREAD is applied to a memory cell having the current-voltage curve "16", the amount of a cell current flowing through the memory cell is smaller than a reference current $I_{REF}$, thus making a read failure. That is, a read failure in the defective cell causes a deterioration of reliability and endurance of the entire device.

The present invention addresses this and other limitations in the prior art.

SUMMARY OF THE INVENTION

Embodiments of the invention include a NOR-type flash memory device capable of checking a progressive fail characteristic. Nonvolatile semiconductor memory devices according to embodiments of the present invention support an erase verify operation mode and a test verify operation mode. The erase verify operation mode determines whether an erased memory cell is lower than a maximal threshold voltage (e.g., 3V), and the test verify operation mode determines whether an erased memory cell has a progressive fail characteristic.

In some of the embodiments, once the memory device enters the test verify operation mode, a wordline voltage to be applied to a memory cell and a reference wordline voltage to be applied to a reference cell are generated. The wordline voltage and the reference wordline voltage generated in the test verify operation mode are set to be higher than those generated in the erase verify operation mode. Therefore, a current flowing through the memory cell and the reference cell is increased to check a memory cell with a progressive (or potential) fail characteristic.

DETAILED DESCRIPTION OF THE PREFERRED EMBODIMENT

Figure 1:
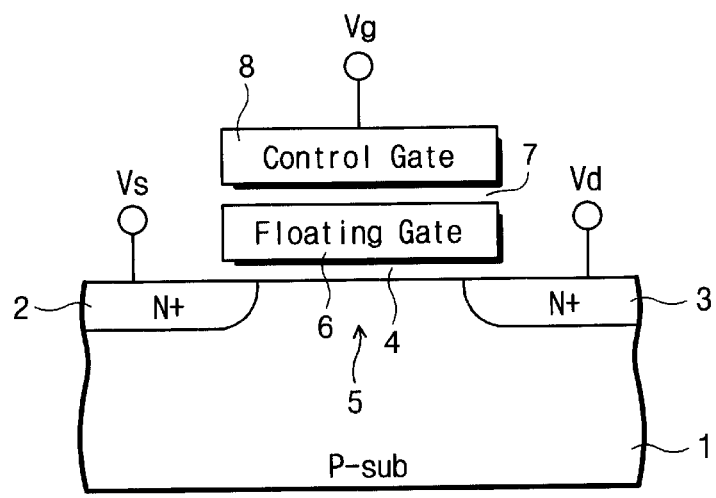
FIG. 1 is a cross-sectional view showing a construction of a conventional flash memory cell.
Figure 2:
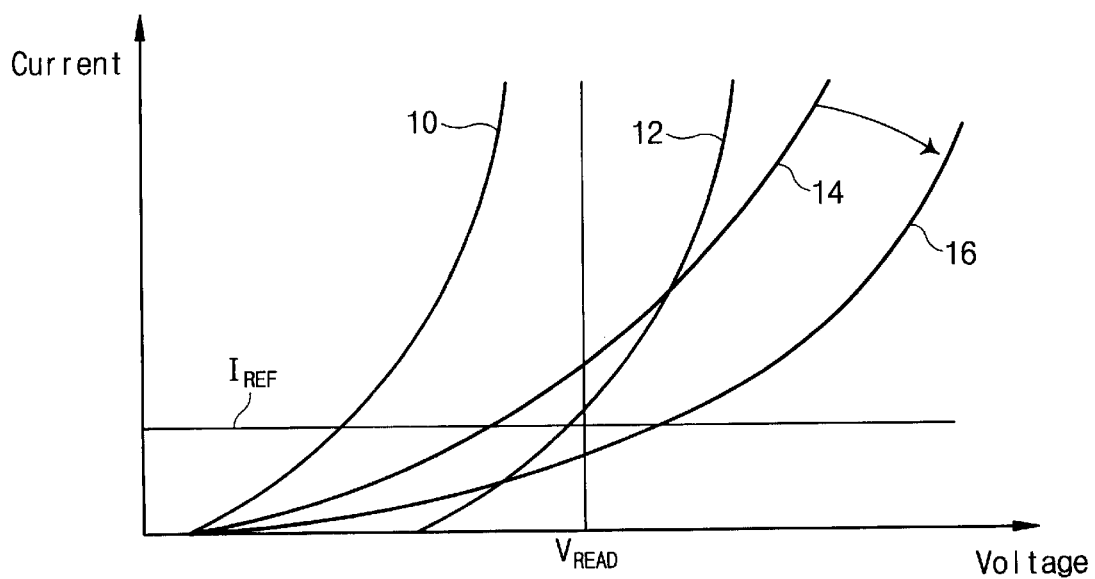
FIG. 2 is a graph showing a relationship between a wordline voltage and a cell current.
Figure 3:
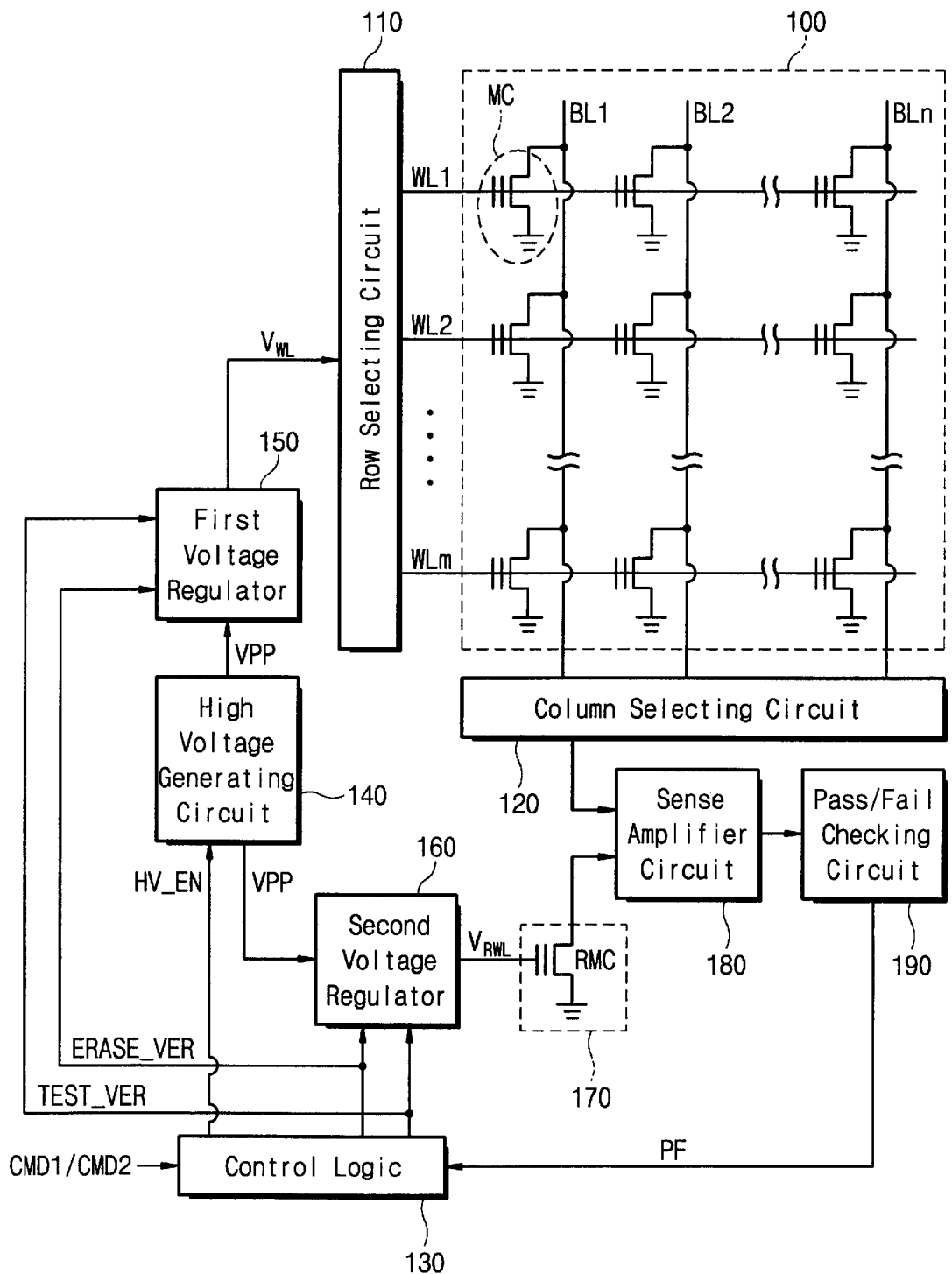
FIG. 3 is a block circuit diagram showing a flash memory device according to an embodiment of the present invention.

A NOR-type flash memory device according to an embodiment of the present invention is illustrated in FIG. 3. The flash memory device includes a memory cell array 100 that includes a plurality of wordlines WLi (i=1–m), a plurality of bitlines BLj (j=1–n), and a plurality of memory cells MC arranged in a matrix of the bitlines and the wordlines. Each of the memory cells MC is made of a floating gate transistor having a drain connected to a corresponding bitline (e.g., BL1), a control gate connected to a corresponding wordline (e.g., WL1), and a grounded source. The wordlines WL1–WLm are coupled to a row selecting circuit 110, and the bitlines BL1–BLn are coupled to a column selecting circuit 120. The row selecting circuit 110 selects one of the wordlines WL1–WLm, and provides a wordline voltage to the selected one. Although not specifically shown in FIG. 3, it is apparent to those skilled in the art that the row selecting circuit 110 includes a row counter for generating a row address, and a row decoder (or row selector) for decoding an output of the row counter or an externally provided row address to select a wordline. Similarly, it is apparent to those skilled in the art that the column selecting circuit 120 includes a column counter for generating a column address, and a column decoder (or column selector) for decoding an output of a column counter or an externally provided column address to select bitlines.

Still referring to FIG. 3, the flash memory device further includes a set of control circuitry or control logic 130, a high voltage generating circuit 140, a first voltage regulator 150, a second voltage regulator 160, a reference current generating circuit 170, a sense amplifier circuit 180, and a pass/fail checking circuit 190.

The control logic 130 controls the high voltage generating circuit 140, the first voltage regulator 150, and the second voltage regulator 160 in response to an external command so as to carry out an operation (e.g., an erase verify operation or a test verify operation) corresponding to the external command. When the external command indicates a normal erase verify operation, the control logic 130 outputs an erase verify operation signed ERASE_VER; when the external command indicates a test verify operation, the control logic 130 outputs a test verify signal TEST_VER. The "test verify operation" is a test operation mode for determining whether an erased memory cell has a normal current-voltage curve. The "erase verify operation" is a normal operation mode for determining whether a threshold voltage of an erased memory cell exists in a threshold voltage distribution, as described above. The erase verify operation and the test verify operation may be carried out in the same manner as a conventional read operation, except for biasing conditions. The control logic 130 generates a high voltage enable signal HV_EN, once an external command is applied thereto.

The high voltage generating circuit 140 generates a high voltage in response to receiving the high voltage enable signal HV_EN outputted from the control logic 130. The first voltage regulator 150 receives a high voltage from the high voltage generating circuit 140, and generates a wordline voltage $V_{WL}$ in response to receiving an erase verify signal ERASE_VER or the test verify signal TEST_VER outputted from the control logic 130. The wordline voltage $V_{WL}$ is to be provided to a selected wordline through the row selecting circuit 110. A wordline voltage $V_{WL}$ generated when the erase verify signal ERASE_VER is received lower than a wordline voltage $V_{WL}$ generated when the test verify signal TEST_VER is received. This will be explained in detail below. The second voltage regulator 160 receives a high voltage from the high voltage generating circuit 140, and generates a reference wordline voltage $V_{RWL}$ in response to receiving the erase verify signal ERASE_VER or the test verify signal TEST_VER outputted from the control logic 130. The reference wordline voltage $V_{RWL}$ is provided to a reference cell RMC that constitutes the reference current generating circuit 170 and generates a reference current in accordance with the reference wordline voltage $V_{RWL}$. A reference wordline voltage $V_{RWL}$ generated when signaled by the erase verify signal ERASE_VER is lower than a reference wordline voltage $V_{RWL}$ generated when signaled by the test verify signal TEST_VER. This will be explained in detail below.

The sense amplifier circuit 180 determines whether an amount of a cell current flowing through at least one memory cell addressed by the row and column selecting circuits 110 and 120 is larger than an amount of a reference current from the reference current generating circuit 170. For example, if an amount of a cell current is larger than an amount of a reference current, an outputted determination result is that the selected memory cell is an "on-cell". If an amount of the cell current is smaller than an amount of the reference current, an outputted determination result is that the selected memory cell is an "off-cell". The pass/fail checking circuit 190 outputs a pass/fail signal PF, informing an erasing result of a selected memory cell, in response to an output of the sense amplifier circuit 180. If the selected memory cell is determined as an off-cell, an output signal of a control logic (an erase verify signal or a test verify signal) is inactivated by the pass/fail signal PF outputted from the pass/fail checking circuit 190.

According to embodiments of the present invention, a wordline voltage VWL and a reference wordline voltage $V_{RWL}$ generated in a test verify operation are higher than those generated in an erase verify operation. Accordingly, this means that an amount of a current flowing through a selected memory cell and a reference cell in the test verify operation is larger than an amount of a current flowing therethrough in the erase verify operation. Therefore, it is relatively easy to check a memory cell with a progressive (or potential) fail characteristic.

Figure 4:
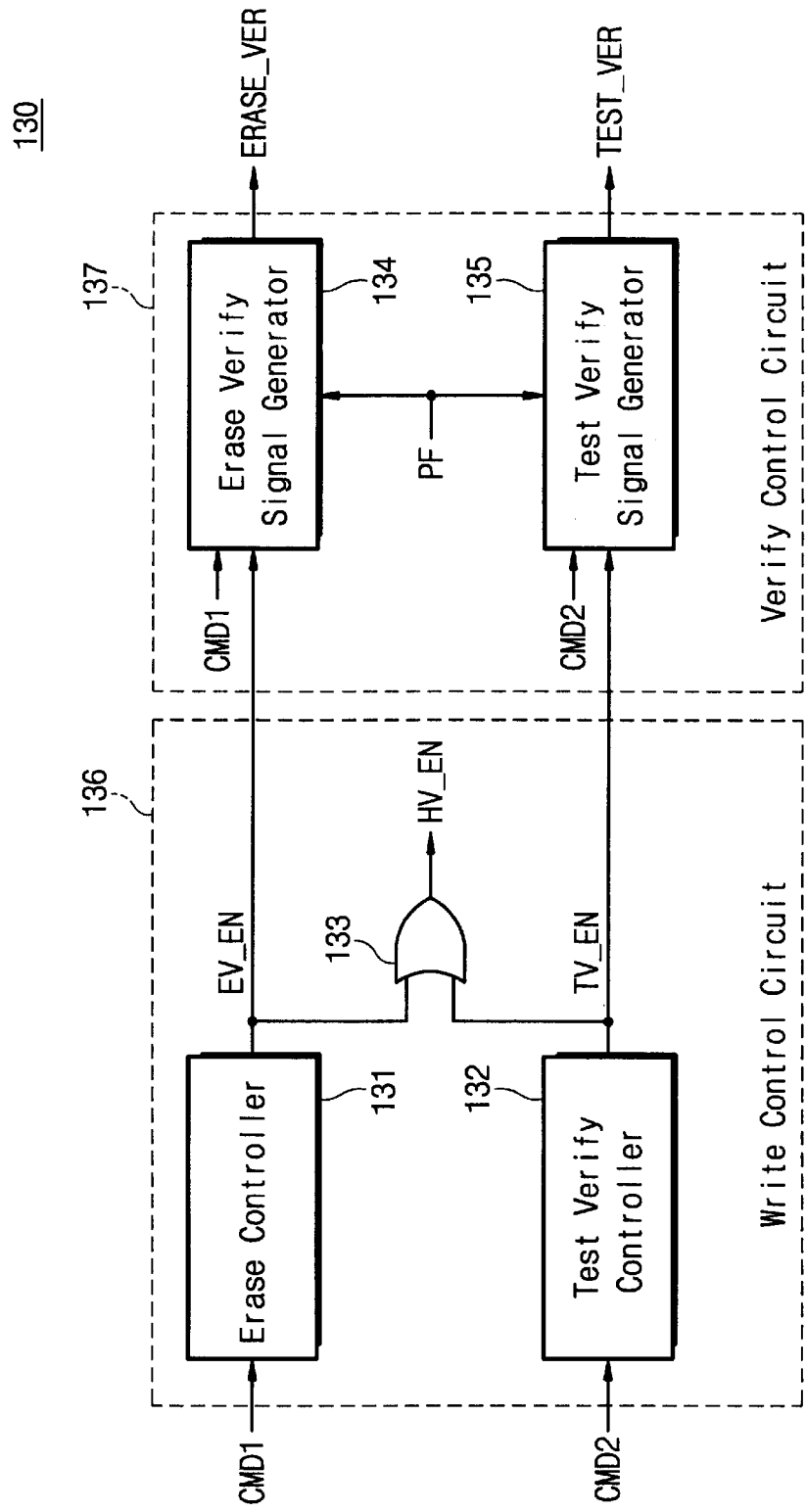
FIG. 4 is a block diagram showing a control logic shown in FIG. 3.
Figure 5A:
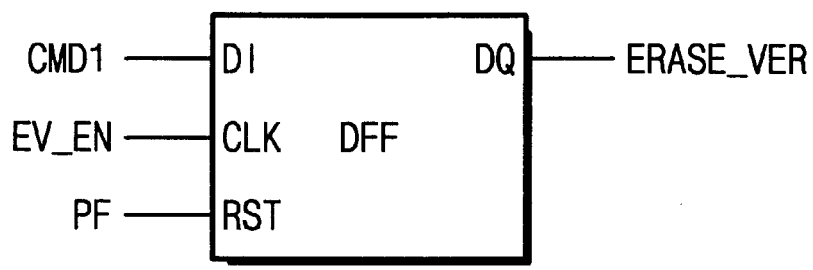
FIG. 5A is a diagram showing an example write controller for the device shown in FIG. 4.
Figure 5B:
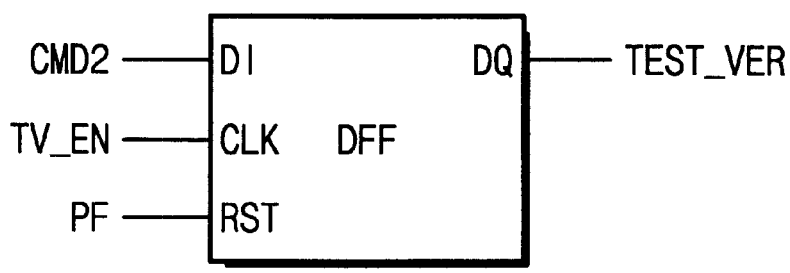
FIG. 5B is a diagram showing an example verify controller for the device shown in FIG. 4.

FIG. 4 is a block diagram of an example control logic circuit shown in FIG. 3. A control logic circuit 130 includes a write control circuit 136 and a verify control circuit 137.

The write control circuit 136 includes an erase controller 131, a test verify controller 132, and an OR gate 133. The erase controller 131 generates an erase verify enable signal EV_EN in response to an external command CMD1 that signifies an erase verify operation. The test verify controller 132 generates a test verify enable signal TV_EN in response to an external command CMD2 that signifies a test verify operation. When either one of the signals EV_EN or TV_EN is enabled, a high voltage enable signal HV_EN is output from the OR gate 133.

The verify control circuit 137 includes an erase verify signal generator 134 and a test verify signal generator 135. The erase verify signal generator 134 can be made of, for instance, a D flip-flop having an input terminal D1 for receiving an external command CMD1, a clock terminal CLK for receiving an erase verify enable signal EV_EN as a clock signal, a reset terminal RST for receiving a pass/fail signal, and an output terminal DQ for generating an erase verify signal ERASE_VER. The erase verify signal generator 134 generates the erase verify signal ERASE_VER in response to the external command CMD1 when the erase verify enable signal EV_EN is enabled. The enabled erase verify signal ERASE_VER is disabled as a pass/fail signal PF outputted from the pass/fail checking circuit 190 is enabled.

Similarly, the test verify signal generator 135 can also be made of a D flip-flop having an input terminal D1 for receiving an external command CMD2, a clock terminal CLK for receiving a test verify enable signal TV_EN as a clock signal, a reset terminal RST for receiving a pass/fail signal, and an output terminal DQ for generating a test verify signal TEST_VER. The test verify signal generator 134 generates the test verify signal TEST_VER in response to the external command CMD2 when the test verify enable signal TV_EN is enabled. The enabled test verify signal TEST_VER is disabled as a pass/fail signal PF outputted from the pass/fail checking circuit 190 is enabled.

Figure 6:
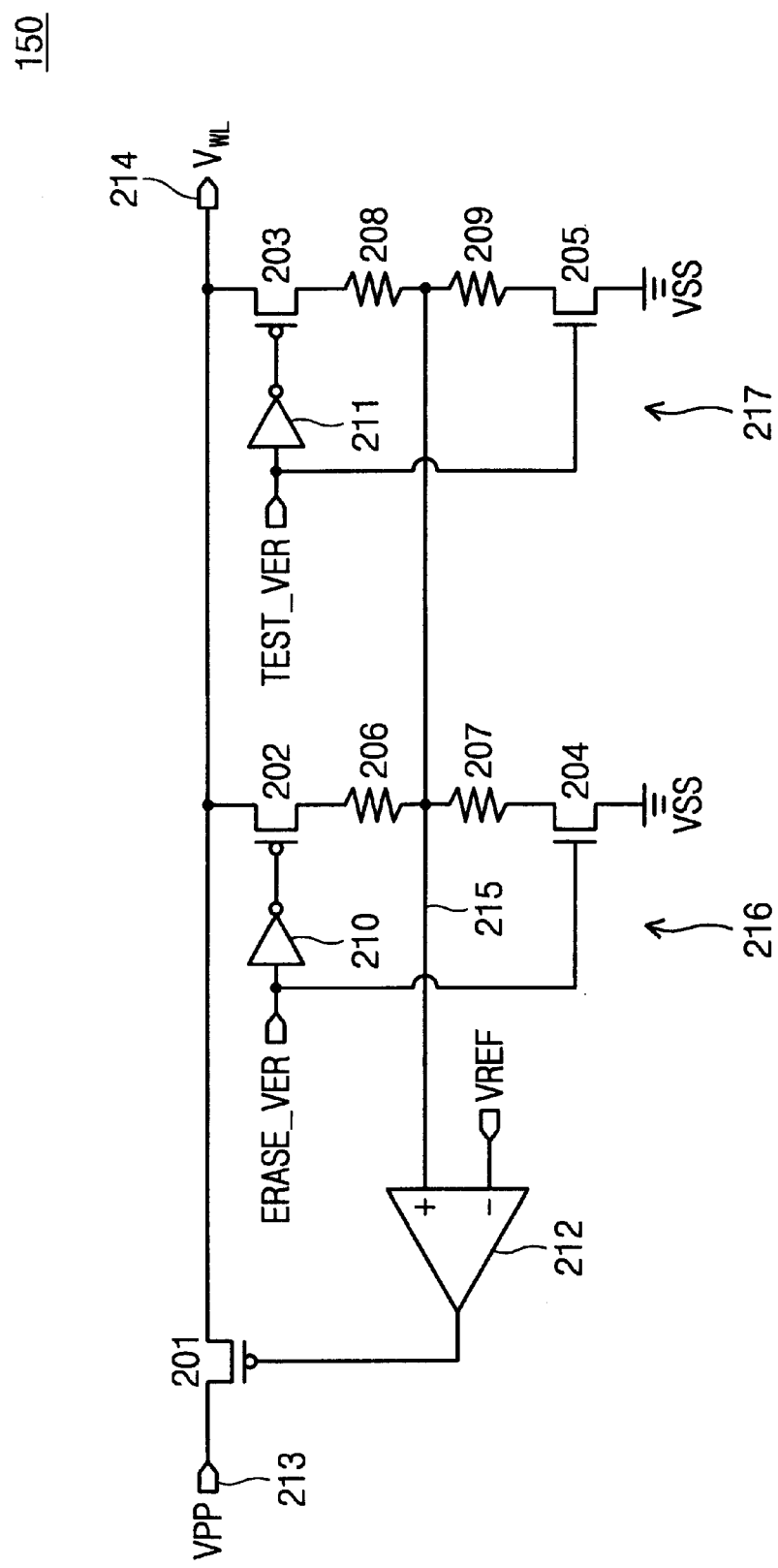
FIG. 6 is a diagram showing details of an embodiment of a first voltage regulator shown in FIG. 3.

FIG. 6 illustrates a preferred embodiment of the first voltage regulator 150 shown in FIG. 3. The first regulator 150 shown if FIG. 6 includes three PMOS transistors 201, 202, and 203, two NMOS transistors 204 and 205, four resistors 206, 207, 208, and 209, two inverters 210 and 211, and a comparator 212. The PMOS transistor 201 is connected between an input terminal 213 receiving a high voltage VPP and an output terminal 214 outputting a wordline voltage VWL, and is controlled by an output signal of the comparator 212. The PMOS transistor 202, the resistors 206 and 207, and an NMOS transistor 204 are serially connected between the output terminal 214 and a ground voltage VSS. The PMOS transistor 202 is 25 controlled by an inverted version of the erase verify signal ERASE_VER through the inverter 210, and the NMOS transistor 204 is controlled directly by the erase verify signal ERASE_VER. The PMOS transistor 203, the resistors 208 and 209, and the NMOS transistor 205 are serially connected between the output terminal 214 and the ground voltage VSS. The PMOS transistor 203 is controlled by an inverted version of the test verify signal TEST_VER through the inverter 211, and the NMOS transistor 205 is directly controlled by the test verify signal TEST_VER. The comparator 212 compares a voltage of a signal line 215 with a reference voltage VREF, and then controls the PMOS transistor 201 based upon the comparing result. The signal line 215 is electrically connected to a connecting node between the resistors 206 and 207, and a connecting node between the resistors 208 and 209.

In such a circuit configuration, a resistance ratio of the resistors 206 and 207 is designed to be different from a resistance ratio of the resistors 208 and 209 so that a wordline voltage VWL generated in enabling the test verify signal TEST_VER can be higher than a wordline voltage VWL generated in enabling the erase verify signal ERASE_VER. In FIG. 6, the inverter 210, the PMOS transistor 202, the NMOS transistor 204, and the resistors 206 and 207 constitute a first voltage distributing circuit 216 that operates when the erase verify signal ERASE_VER is enabled. Similarly, the inverter 211, the PMOS transistor 203, the NMOS transistor 205, and the resistors 208 and 209 constitute a second voltage distributing circuit 217 that operates when the test verify signal ERASE_VER is enabled. As mentioned above, the erase verify signal ERASE_VER is enabled in a normal verify operation mode while the test verify signal TEST_VER is enabled in a test verify operation mode. That is, the erase verify signal ERASE_VER and the test verify signal TEST_VER are exclusively and not simultaneously enabled.

Figure 7:
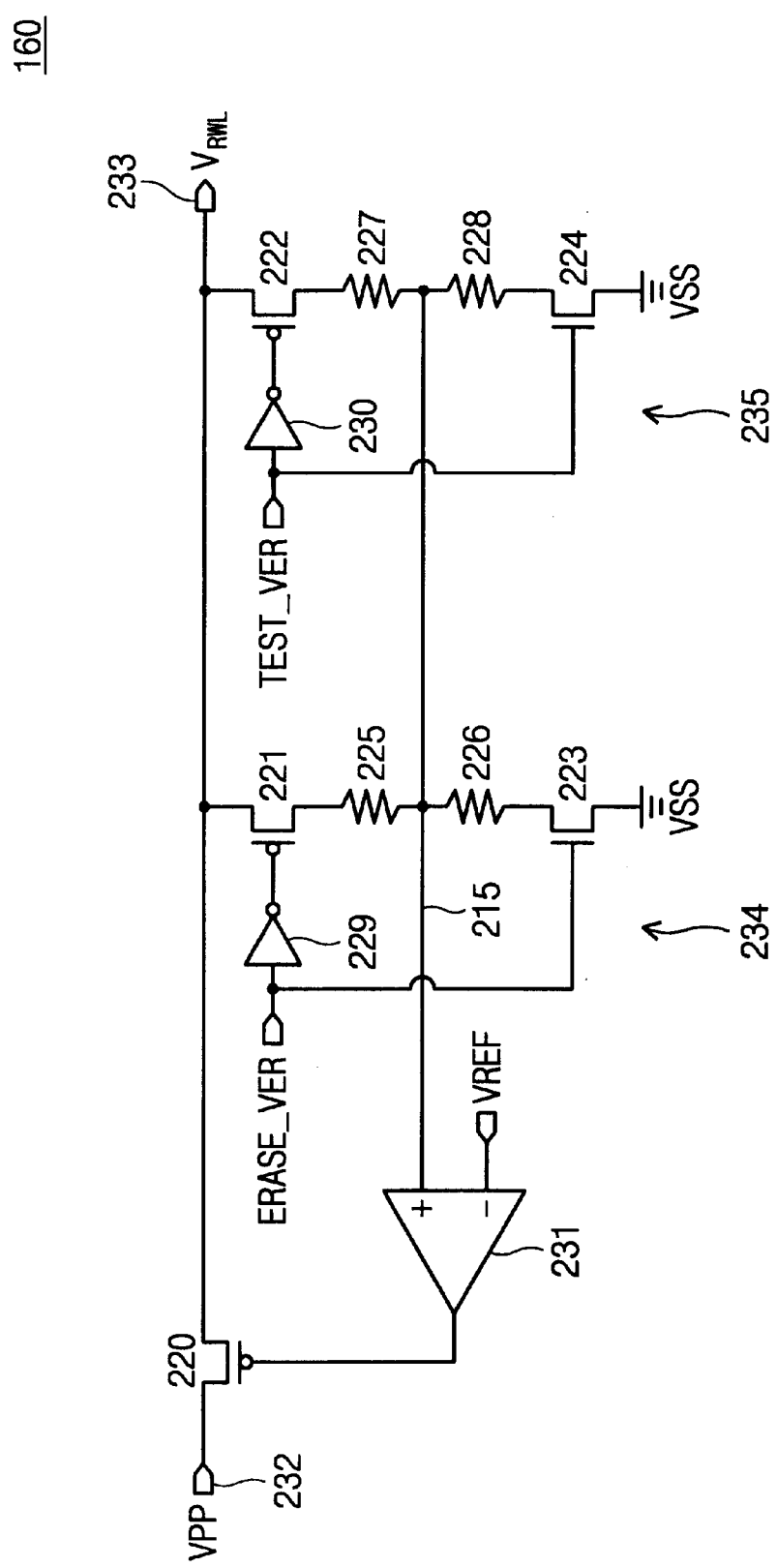
FIG. 7 is a diagram showing details of an embodiment of a second voltage regulator shown in FIG. 3.

FIG. 7 illustrates a preferred embodiment of the second voltage regulator 160 shown in FIG. 3. The second voltage regulator 160 shown in FIG. 7 includes a PMOS transistor 220, a comparator 231, and first and second voltage distributing circuits 234 and 235. The PMOS transistor 220 is connected between an input terminal 232 for receiving a high voltage VPP and an output terminal for outputting a reference wordline voltage $V_{RWL}$, and is controlled by an output signal of the comparator 231. The first voltage distributing circuit 234 is coupled to the output terminal 233, and distributes the output voltage $V_{RWL}$ in response to receiving an erase verify signal ERASE_VER. Also the first voltage distributing circuit 234 includes a PMOS transistor 221, an NMOS transistor 223, resistors 225 and 226, and an inverter 229. The PMOS transistor 221, the resistors 225 and 226, and the NMOS transistor 223 are serially connected between the output terminal 233 and a ground voltage VSS. The PMOS transistor 221 is controlled by an inverted version of the erase verify signal ERASE_VER through the inverter 229, and the NMOS transistor 223 is directly controlled by the erase verify signal ERASE_VER. The second voltage distributor 235 is coupled to the output terminal 233, and distributes the output voltage $V_{RWL}$ in response to receiving the test verify signal TEST_VER. Also the second voltage distributor 235 includes a PMOS transistor 222, an NMOS transistor 224, resistors 227 and 228, and an inverter 230. The PMOS transistor 222, the resistors 227 and 228, and the NMOS transistor 224 are serially connected between the output terminal 233 and a ground voltage VSS. The PMOS transistor 222 is controlled by an inverted version of the test verify signal TEST_VER through the inverter 230, and the NMOS transistor 224 is directly controlled by the test verify signal TEST_VER.

In such a circuit construction, a resistance ratio of the resistors 225 and 226 is designed to be different from a resistance ratio of the resistors 227 and 228 so that a reference wordline voltage $V_{RWL}$ generated by receiving the test verify signal TEST_VER can be higher than a reference wordline voltage $V_{RWL}$ generated by receiving the erase verify signal ERASE_VER.

Figure 8:
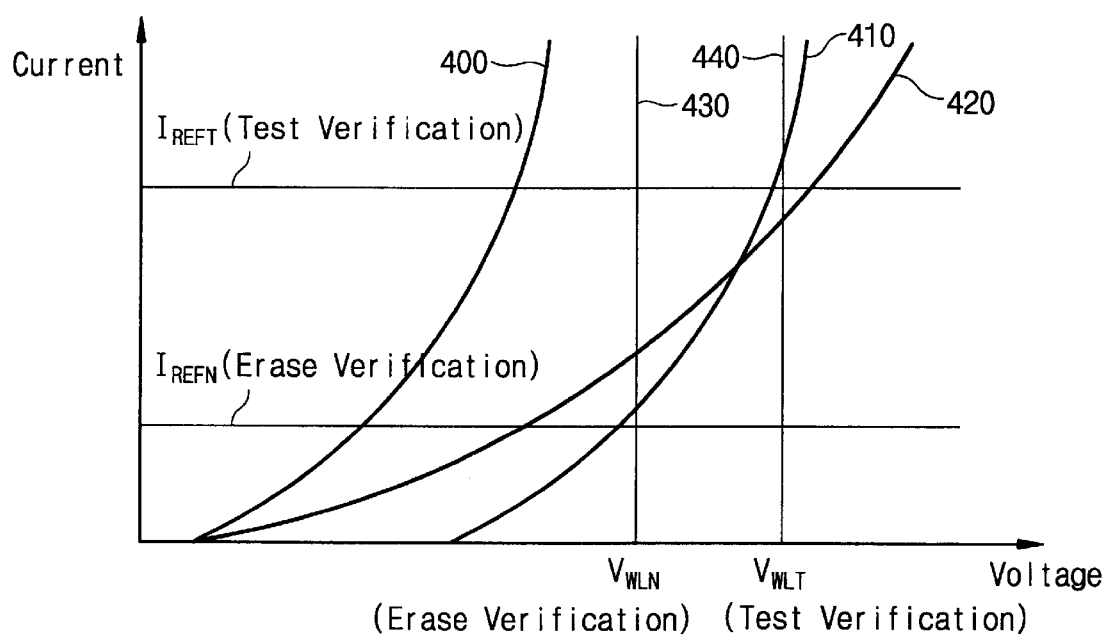
FIG. 8 is a graph showing a reference current and a wordline voltage that are varied with a wordline voltage control method.

FIG. 8 illustrates a reference current and a wordline voltage that are varied with a method of controlling a wordline voltage. A curve 400 is a current-voltage curve of a memory cell having the lowest acceptable threshold voltage (e.g., 1V), and a curve 410 is a current-voltage curve of a memory cell having the highest acceptable threshold voltage (e.g., 3V). A current-voltage curve of normally erased memory cells (i.e., a normal current-voltage curve) may exist between the current-voltage curves 400 and 410.

A solid line $I_{REFN}$ represents a reference current that is generated from the reference current generating circuit 170 when an erase verify operation is carried out, as described above. A solid line $I_{REFT}$ represents a reference current that is generated from the reference current generating circuit 170 when a test verify operation is carried out. A current-voltage curve 420 is a current-voltage curve of a memory cell having a progressive fail characteristic.

If the current-voltage curves 400 and 410 of a normal memory cell and the current-voltage curve 420 of an abnormal memory cell are shown as in FIG. 8, a threshold voltage of an erased memory cell (i.e., on-cell) is generally distributed from a maximal threshold voltage (e.g., 3V) to a minimal threshold voltage (e.g., 1V). Most normal memory cells have approximately the same slope of a current-voltage curve irrespective of a memory cell having the minimal threshold voltage and a memory cell having the maximal threshold voltage. In an erase verify operation for determining whether an erased memory cell is lower than a maximal threshold voltage, referring to FIGS. 3 and 8, a reference wordline voltage $V_{RWL}$ is applied to the reference cell RMC of the reference voltage generating circuit 170 so that the reference current $I_{REFN}$ can flows through the reference cell RMC. At the same time, a wordline voltage $V_{WLN}$ is applied to a selected memory cell. The sense amplifier circuit 180 compares the cell current flowing through the selected memory cell to the reference current $I_{REFN}$, determines whether the selected memory cell is normally erased, and generates an appropriate output signal.

After the erase operation is completed, there may be one or more memory cells that have the abnormal current-voltage curve 420, due to various reasons even if the selected memory cell is a memory cell having the minimal threshold voltage and therefore passes the first test. The memory cell having the current-voltage curve 420 passes the normal erase verify operation, because the amount of its cell current (decided at the intersection of 430 and 410) flowing when the wordline voltage $V_{WLN}$ is applied to the memory cell, is larger than the amount of the reference current $I_{REFN}$. Unfortunately, the memory cell having the current-voltage curve 420 suffers from a potential problem that can deteriorate reliability and endurance of products containing such cells. Namely, it is substantially impossible to check a memory cells having abnormal current-voltage curves using the conventional erase verify method.

To check a memory cell having an abnormal current-voltage curve, the NOR-type flash memory described above supports a test verify operation mode that can be run after completion of an erase operation that includes pre-program, main erase, and post-program operations. As shown in FIGS. 3 and 8, in the test verify operation mode, a voltage $V_{WLT}$, which is higher than a wordline voltage $V_{WLN}$ used in the erase verify operation, is applied to a selected memory cell, thereby increasing the cell current flowing through the selected memory cell. At the same time, a voltage $V_{RWLT}$, which is higher than a reference wordline voltage $V_{RWLN}$ used in the erase verify operation, is applied to the reference cell RMC, thereby increasing the reference current $I_{REFT}$ flowing through the reference cell RMC.

Under such biasing conditions, memory cells having normal current-voltage curves between 400 and 410 are determined to have passed the second test, just as they passed the first test (erase verify). On the other hand, memory cells having an abnormal voltage-current curve such as 420 are determined to have failed the second test, although they would have passed the first test. That is, as shown in FIG. 8, an amount of cell current (decided at the intersection of 420 and 440) flowing when a wordline voltage $V_{WLT}$ is applied to the memory cell selected for a test verify operation is smaller than the reference current $I_{REFT}$. Thus, it is possible to check memory cells having an abnormal (or shallow) slope of a current-voltage curve in advance.

As explained thus far, a flash memory device according to embodiments of the present invention supports a test verify operation mode in which a wordline voltage and a reference wordline voltage are set higher than when the device is in an erase verify operation mode. Under such biasing conditions, a cell current flowing through a selected memory cell and a reference current provided by a reference cell are simultaneously increased. Accordingly, a memory cell having an abnormal current-voltage curve is determined as an off-cell thereby allowing screening for memory cells with a progressive fail characteristic before releasing products. Thus, reliability and endurance of the products can be improved.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described to explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A flash memory device comprising:
    an array including a plurality of wordlines, a plurality of bitlines, and a plurality of nonvolatile memory cells located at intersections of the wordlines and bitlines;
    a column selecting circuit coupled to the array, the column selecting circuit for selecting a part of the bitlines;
    a row selecting circuit coupled to the array, the row selecting circuit for selecting one of the wordlines and providing a wordline voltage to the selected one;
    at least one reference cell for generating a reference current in response to a reference wordline voltage;
    a write control circuit for generating a test verify enable signal and a high voltage enable signal in response to receiving a test command directing the memory device to operate in a test operation mode;
    a verify control circuit for generating a test verify signal in response to the test command when the test verify enable signal is enabled;
    a high voltage generating circuit for generating a high voltage signal in response to receiving the high voltage enable signal;
    a first voltage regulator for receiving the high voltage signal and generating the reference wordline voltage in response to the test verify signal;
    a second voltage regulator for receiving the high voltage signal and generating the wordline voltage in response to the test verify signal;
    a sense amplifier circuit for determining whether an amount of a cell current flowing through an erased memory cell selected by the column selecting circuit and the row selecting circuit is larger than an amount of the reference current; and
    a pass/fail checking circuit for generating a pass/fail signal in response to an output of the sense amplifier circuit,
    wherein the test verify signal is disabled by the pass/fail signal indicating that the amount of the cell current is larger than the amount of the reference current; and
    wherein the wordline and reference wordline voltages generated for the test operation mode are higher than those generated for an erase verify operation mode.

2. The memory device according to 1, wherein the write control circuit is structured to generate an erase verify enable signal when it receives a command directing the memory device to operate in the erase verify operation mode.

3. The memory device according to claim 2, wherein the verify control circuit is structured to generate an erase verify signal in response to receiving the command directing the memory device to operate in the erase verify operation mode when the erase verify enable signal is enabled.

4. The memory device according to claim 3, wherein the write control circuit comprises:
    an erase controller structured to generate the erase verify enable signal in response to receiving the command directing the memory device to operate in the erase verify operation mode;
    a test verify controller structured to generate the test verify enable signal in response to receiving the command directing the memory device to opeate in the test operation mode; and
    an OR gate coupled to the erase controller and to the test verify controller, the OR gate structured to generate the high voltage enable signal when either the erase controller or the test verify controller is enabled.

5. The memory device according to claim 3, wherein the verify control circuit includes:
    a first flip-flop having an input terminal for receiving the command directing the memory device to operate in the erase verify operation mode, a clock terminal for receiving the erase verify enable signal, a reset terminal for receiving the pass/fail signal, and an output terminal for outputting the erase verify signal; and
    a second flip-flop having an input terminal for receiving the command directing the memory device to operate in the test operation mode, a clock terminal for receiving the test verify enable signal, a reset terminal for receiving the pass/fail signal, and an output terminal for outputting the test verify signal.

6. The memory device according to claim 5, wherein the second voltage regulator generates a first wordline voltage in response to receiving the erase verify signal and generates a second wordline voltage in response to receiving the test verify signal, the first wordline voltage being lower than the second wordline voltage.

7. The memory device according to claim 5, wherein the first voltage regulator generates a first reference wordline voltage in response to receiving the erase verify signal and generates a second reference wordline voltage in response receiving to the test verify signal, the first reference wordline voltage being lower than the second reference wordline voltage.

8. A memory device, comprising:
    an array including a plurality of wordlines, a plurality of bitlines, and a plurality of nonvolatile memory cells located at intersections of the wordlines and bitlines;
    a cell selecting circuit structured to drive a selected one of the memory cells to conduct current;
    a reference cell for generating a reference current in response to a reference cell driving signal;
    a verification circuit for generating an erase verify signal in response to receiving a first verify command directing the memory device to operate in an erase verify mode, and for generating a test verify signal in response to receiving a second verify command directing the memory device to operate in a testing mode;

a testing cell driving circuit coupled to the verification circuit and having an output terminal coupled to the cell selecting circuit, the testing cell driving circuit structured to generate a first testing cell driving signal when it receives the erase verify signal and structured to generate a second testing cell driving signal when it receives the test verify signal;

a reference cell driving circuit coupled to the verification circuit and having an output terminal coupled to the reference cell, the reference cell driving circuit structured to generate a first reference cell driving signal when it receives the erase verify signal and structured to generate a second reference cell driving signal when it receives the test verify signal; and a determining circuit coupled to the selected one of the memory cells and to the reference cell, the determining circuit structured to generate a first passing signal in response to comparing current from the selected memory cell driven by the first testing cell driving signal to current from the reference cell driven by the first reference cell driving signal, and structured to generate a second passing signal in response to comparing current from the selected memory cell driven by the second testing cell driving signal to current from the reference cell driven by the second reference cell driving signal.

9. The memory device according to claim 8 wherein a voltage of the first testing cell driving signal is lower than a voltage of the second testing cell driving signal.

10. The memory device according to claim 8 wherein a voltage of the first reference cell driving signal is lower than a voltage of the second reference cell driving signal.

11. The memory device according to claim 8, wherein the testing cell driving circuit comprises:

a high voltage generating circuit for generating a pumped voltage; and a first voltage regulator having a first input for receiving the erase verify signal, a second input for receiving the test verify signal, a third input for receiving the pumped voltage, and an output coupled to the cell selecting circuit.

12. The memory device according to claim 11, wherein the first voltage regulator further comprises:

a first voltage generating circuit coupled the pumped voltage and for generating the first testing cell driving signal in response to receiving the erase verify signal; and a second voltage generating circuit coupled the pumped voltage and for generating the second testing cell driving signal in response to receiving the test verify signal.

13. The memory device according to claim 8, wherein the reference cell driving circuit comprises:

a first voltage generating circuit coupled to a pumped voltage and for generating the first reference cell driving signal in response to receiving the erase verify signal; and a second voltage generating circuit coupled the pumped voltage and for generating the second reference cell driving signal in response to receiving the test verify signal.

14. The memory device according to claim 8, wherein the determining circuit comprises:

a sense amplifier including:
  a first input coupled to the selected one of the memory cells;
  a reference input coupled to the reference cell; and
  an output; and a pass/fail circuit having an input coupled to the output of the sense amplifier, the pass/fail circuit for generating the first and second passing signal at an output terminal in response to a signal received from the output of the sense amplifier.

15. The memory device according to claim 14, wherein the output of the pass/fail circuit is coupled to the verification circuit.

16. A method of testing programmable memory cells in a memory device, the method comprising:

driving a selected one of the programmable memory cells with a first cell driving signal to generate a first memory cell current;

driving a reference cell with a first reference driving signal to generate a first reference current;

comparing the first memory cell current to the first reference current, and, if the first memory cell current is greater than the first reference current,
  driving the selected one of the programmable memory cells with a second cell driving signal to generate a second memory cell current, the second memory cell current higher than the first memory cell current;
  driving the reference cell with a second reference driving signal to generate a second reference current; and
  comparing the second memory cell current to the second reference current.

17. The method of claim 16, further comprising generating a cell passing signal indicating that the second memory cell current is greater than the second reference current.

18. The method of claim 16 wherein driving a selected one of the programmable memory cells with a first cell driving signal and driving a reference cell with a first reference driving signal occurs after a control logic circuit receives a command to perform an erase verification test.

19. The method of claim 16 wherein driving the selected one of the programmable memory cells with the second cell driving signal and driving the reference cell with a second reference driving signal occurs after a control logic circuit receives a command to perform a test verification procedure.

20. The method of claim 18, further comprising:

generating a cell erased signal if the first memory cell current is greater than the first reference current; and if the cell erased signal is generated:
  stopping driving the selected one of the programmable memory cells, and
  stopping driving the reference cell.

21. The method of claim 19, further comprising:

generating a cell passing signal if the second memory cell current is greater than the second reference current; and if the cell passing signal is generated:
  stopping driving the selected one of the programmable memory cells, and
  stopping driving the reference cell.

* * * * *